United States Patent [19]

McGinn

[11] 4,393,354
[45] Jul. 12, 1983

[54] CROSSOVER CIRCUIT FOR USE IN AUTOMATIC GAIN CONTROL SYSTEMS

[75] Inventor: Michael McGinn, Tempe, Ariz.
[73] Assignee: Motorola, Inc., Schaumburg, Ill.
[21] Appl. No.: 220,605
[22] Filed: Dec. 29, 1980
[51] Int. Cl.³ ............................................. H03G 3/30
[52] U.S. Cl. ..................................... 330/280; 330/138; 358/178
[58] Field of Search ............... 330/133, 134, 138, 148, 330/280; 358/178, 179; 455/241, 242, 243, 251

[56] References Cited
U.S. PATENT DOCUMENTS 4,246,543  1/1981  Noda et al. .................. 330/134 X Primary Examiner—James B. Mullins
Attorney, Agent, or Firm—Michael D. Bingham

[57] ABSTRACT

A unity gain, closed loop, feedback amplifier is described which accurately defines the changeover point in an AGC system to provide a first output which varies in response to an AGC input signal and is indicative of the level thereof up to a predetermined threshold value and thereafter remains constant and then to provide a second output which is indicative of the applied AGC input signal becoming more positive than the threshold level. The amplifier changeover circuit comprises a first circuit loop and a second circuit loop coupled with a comparator amplifier which is adapted to receive the AGC input signal. With the AGC input signal being less than the threshold level the first circuit loop is responsive to increases in the input signal to provide an output signal which is indicative of the level thereof. During this region of the AGC input signal the second circuit loop is held non-responsive until such time that the AGC input signal becomes more positive than the threshold level at which time a second output a signal is produced therefrom which is indicative of the level of the AGC input signal. The output of the first circuit loop is maintained constant at a bias reference level during the interval that the second circuit loop is rendered responsive to the AGC input signal.

18 Claims, 2 Drawing Figures

CROSSOVER CIRCUIT FOR USE IN AUTOMATIC GAIN CONTROL SYSTEMS

CROSS REFERENCE TO RELATED APPLICATION

The subject matter of this disclosure is related to the subject matter of U.S. patent application, Ser. No. 220,607, entitled "LARGE SCALE, SINGLE CHIP INTEGRATED CIRCUIT TELEVISION RECEIVER SUBSYSTEM" filed concurrently herewith which is assigned to Motorola Inc.

BACKGROUND OF THE INVENTION

1. Field of the Invention

The present invention relates to automatic gain control systems and more particularly to a changeover circuit for providing output signals indicative of the level of an automatic gain control (A.G.C.) input signal supplied thereto.

2. Background of the Prior Art

If the amplitude of the composite video signal developed in a television receiver is allowed to vary significantly, a strong incoming signal may cause the video amplifiers of the receiver to become overloaded resulting in cross modulation and clipping of the synchronizing components of the signal, while a weak incoming signal may cause the output of the video amplifiers to be too low to provide proper picture reproduction. In addition, unwanted variations of contrast may result from a video signal which is changing in amplitude. Therefore, in all television receivers some form of automatic gain control (A.G.C.) is used to keep the detected video constant despite variations in the level of the composite radio frequency (RF) input signal. The most common system is to sample and make the synch, the tip of the composite video signal equal to a direct current (DC) reference voltage. This is normally effected by means of a gated amplifier which derives a voltage (stored on a capacitor) the level of which first gain reduces the IF amplifier as the input signal increases, the RF gain remaining unchanged. After some predetermined point, gain reduction of the IF stage ceases and the IF gain remains constant with further gain reduction being made by reducing the gain of the RF stage of the receiver. For example, U.S. Pat. No. 3,697,883, which is incorporated herein by reference, describes such a system.

The overall characteristic of the aforementioned system enables the television receiver to have the best possible signal to noise ratio at low signal levels because the RF gain is fixed and optimized for good noise performance while at high signal levels, where noise performance is not as important, overloading of the receiver and hence intermodulation problems are prevented by the gain reduction of the RF stage. However, the changeover from affecting the gain reduction of the IF stage to the gain reduction of the RF stage should not result in both the RF and RF amplifiers being acted on simultaneously for a large part of the AGC curve, or conversely there should be no gap between the two regions, i.e., IF gain reduction region and the RF gain reduction region. Both of these faults lead to large changes in AGC loop gain and difficulties in controlling the loop response to disturbances.

Some contemporary changeover systems suffer in that the point of changeover between IF and RF gain control is not well-defined and hence suffer from the aforedescribed faults. Thus, there is a need for a circuit of the type being discussed which makes the possibility of either of the aforementioned effects almost zero by reducing the changeover region to negligible proportions. Such a circuit should also fulfill the needs for being suitable to be manufactured as an integrated circuit in a large scale integrated circuit comprising a television reveiver.

SUMMARY OF THE INVENTION

Accordingly, it is an object of the present invention to provide an improved automatic gain control changeover circuit.

Another object of the invention is to provide an automatic gain control changeover circuit for providing output voltages which are indicative of an applied input signal being below and above a predetermined level respectively.

Still another object of the present invention is to provide an automatic gain control changeover circuit for utilization in a television receiver for varying the gain of the IF and RF stages thereof in response to a gain control signal being applied thereto.

In accordance with the above and other objects, there is provided a changeover circuit comprising a first circuit loop and a second circuit loop. The first circuit loop is in a responsive state whenever the magnitude of an applied input signal is below a threshold level set by the magnitude of a reference bias signal supplied thereto to produce an output therefrom which is indicative of the level of the input signal. The second circuit loop coupled with the first circuit loop is held in a non-responsive state until such time as the input signal magnitude becomes greater than the threshold level to produce at that time an output which is indicative of the level of the input signal. As the magnitude of the input signal becomes greater than the threshold level, the first circuit loop becomes non-responsive to maintain the output therefrom substantially constant.

It is a feature of the present invention that the output signals from the first and second circuit loops are provided in response to an automatic gain control signal for varying the gain of the IF and RF stages respectively of a television receiver.

DETAILED DESCRIPTION OF THE PREFERRED EMBODIMENT

Figure 1:
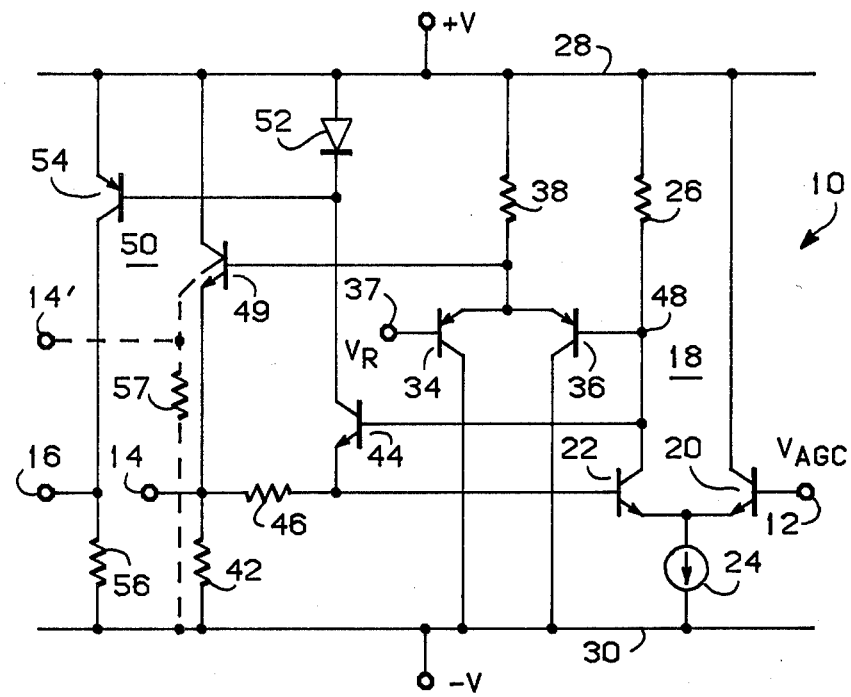
FIG. 1 is a schematic diagram of a changeover circuit of the preferred embodiment of the invention.

Turning to FIG. 1, there is shown a unity gain closed loop feedback changeover circuit 10 of the present invention which is adapted to receive an automatic gain control signal at the input 12 thereof. The AGC input signal supplied at input 12 may be developed across an AGC capacitor as aforedescribed as generally is known. In response to the AGC input signal, changeover circuit 10 provides at respective outputs 14 and 16 a pair of output signals which may be utilized for example for controlling the gain of the IF amplifier stage and RF stage respectively of a television receiver. For instance, not intending to limit the scope of the present invention, changeover circuit 10 could be utilized in conjunction with the gate AGC circuit of the aforementioned U.S.

Pat. No. 3,697,883 to provide the gain control signals to the video IF amplifier and the RF amplifier and converter circuits respectively. Additionally changeover circuit 10 may be utilized in the AGC and RF AGC circuits disclosed in the aforereferenced U.S. patent application, Ser. No. 220,607, entitled "LARGE SCALE, SINGLE CHIP INTEGRATED CIRCUIT TELEVISION RECEIVER SUBSYSTEM" which is incorporated herein by reference. Changeover circuit 10 includes a comparator amplifier 18 comprising NPN transistors 20 and 22 which are coupled in a differential amplifier configuration with the common emitters thereof coupled to current source 24. The collectors of transistors 20 and 22 are returned directly and via resistor 26 respectively to power supply terminal 28 at which is supplied a source of operating potential V+; current source 24 being returned to power supply terminal 30 which receives a ground reference or −V operating potential. A bias reference signal VR is applied at terminal 37 to the base of transistor 34 which is differentially connected with companion PNP transistor 36. The common connected emitters of transistor 34 and 36 are returned to power supply conductor 28 via resistor 38 with the respective collectors thereof coupled to power supply terminal 30. The base of transistor 36 is coupled to the collector of transistor 22 at node 48. The emitters of transistor 34 and 36 are coupled to the base of transistor 49 which is connected in cascade, at output 14, to resistor 42 and via resistor 46 to the second input, the base of transistor 22, of amplifier 18. As shown in phantom, transistor 49 may be a dual emitter transistor with the output of the first circuit loop being taken across resistor 57, at output 14', instead of across resistor 42. In this manner output 14' would be buffered from any changes in signal level across resistor 42 when the first circuit loop is in a non-responsive state.

Figure 2:
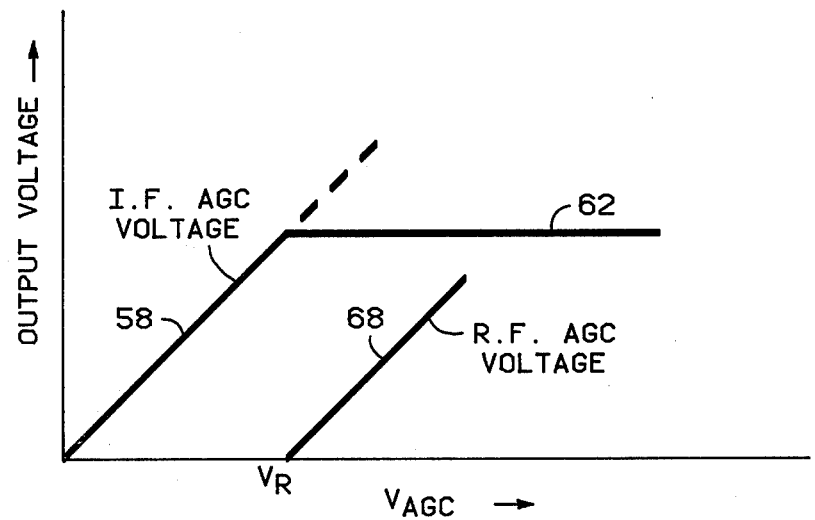
FIG. 2 shows waveforms useful in describing the operation of the circuit shown in FIG. 1.

For all magnitudes of the AGC input signal applied to terminal 12, the first input of amplifier 18, being less than a threshold level set by VR, the first circuit loop comprising transistors 22, 36 and 49 is in a responsive state whereby the output signal at terminal 14 follows changes in the AGC input signal and is indicative of the level thereof. Hence, as shown in FIG. 2, as the AGC input signal increases, the output at terminal 14, waveform portion 58, increases in a linear fashion. The output at terminal 14, for instance, can be utilized to provide the gain reduction function for the IF amplifier stages of the television receiver as aforementioned.

A second circuit loop comprising transistors 22, and transistor 44 is normally in a non-responsive state whenever the first circuit loop is in a responsive state, i.e., with the AGC input signal less than the threshold level transistor 44 is in a non-conductive state because the base-to-emitter junction is zero biased by the first circuit loop comprising transistors 49 and 36 which are coupled between the base of transistor 44 and, via resistor 46, to the emitter of transistor 44. At the crossover point, when the AGC input signal approaches the threshold level set by VR, transistor 36 will begin to turn off since its emitter is biased at a level equal to $VR + V_{be}$, where $V_{be}$ is a base-to-emitter voltage drop. Any further increases in the AGC input signal causes the level at node 48 to increase rapidly to turn off transistor 36 rendering the first circuit loop non-responsive to further changes in the AGC input signal. As the AGC input signal increases beyond the threshold level the second circuit loop comprising transistors 22, and 44 becomes responsive to provide at output 16, via current turnaround circuit 50 (including diode 52 and PNP transistor 54) which is indicative of the further increase in the input signal as is shown by waveform 68. Hence, for example the output signal appearing at output 16, across resistor 56, which increases and is indicative of the applied input signal when the input signal is greater than the reference bias signal VR, can be utilized as the RF gain stage control function. With the second circuit loop being responsive, that is, transistor 44 being rendered conductive, the voltage across resistor 42 and therefore the voltage level at output terminal 14 is held at substantially the value VR, a constant. Thus, in the region above VR the voltage output at terminal 14 is held constant, waveform portion 62, while the output signal at output 16 rises as the input signal moves more positive than VR.

Hence, what has been described above, is a changeover circuit which is suitable to be utilized in a large scale integrated circuit for a television receiver to provide the IF and RF gain functions for controlling the gain of those respective stages in response to a gain controlled input signal applied to the input thereof. In the region where the AGC input signal is below the reference bias signal VR the IF voltage rises with increases in the input signal until the input signal reaches the level of the bias reference signal. Thereafter, the IF voltage remains constant whereas the RF AGC drive voltage rises as the input signal moves more positive than the reference bias signal. The aforedescribed circuit prevents both the IF and RF amplifier stages of the television receiver from being acted on simultaneously while maintaining no gap between the two regions, i.e., the IF gain control region and the RF gain control region. The break point or changeover point at which the IF AGC gain signal is held constant and the RF AGC voltage is allowed to increase with the AGC input signal to the circuit is made adjustable by changing the value of the bias reference signal which is externally generated to the circuit such that the IF voltage output is maintained constant and does not change with variations in temperature. The changeover region is forced to be very small due to the large gain around the amplifier loop of the changeover circuit.

I claim:

1. Circuit for providing output voltages indicative of the level of an applied input signal, comprising:
   first circuit loop means which is responsive to the magnitude of the input signal being less than that of a reference bias signal supplied to said first circuit loop means for providing an output indicative of the level of the input signal, said first circuit loop means being rendered nonresponsive when the magnitude of the input signal exceeds a threshold level set by said reference bias signal such that the output therefrom remains substantially constant; and
   second circuit loop means coupled with said first circuit loop means which is rendered responsive by said first circuit loop means becoming nonresponsive for providing an output indicative of the level of the input signal.

2. Circuit for providing output voltages indicative of the level of an applied input signal, comprising:
   first circuit loop means receiving a reference bias signal which is responsive to the magnitude of the input signal being less than that of said reference bias signal for providing an output indicative of the level of the input signal, said first circuit loop means being rendered nonresponsive when the input signal exceeds a threshold level set by said reference bias signal such that the output therefrom remains substantially constant;

second circuit loop means coupled with said first circuit loop means and being rendered responsive to the input signal exceeding said threshold level for providing an output indicative of the level of the input signal; and comparator amplifier means having first and second inputs and an output, said first input adapted to receive the input signal; said first and second circuit loop means being coupled with said comparator amplifier means between said output and said second input of said comparator amplifier means.

3. The circuit of claim 2 wherein said first circuit loop means includes:

a first transistor having first, second main electrodes and a control electrode, said control electrode being coupled to said output of said comparator amplifier means, said first main electrode being coupled to a terminal at which is supplied said reference bias signal, said second main electrode being coupled to a first power supply conductor; and a second transistor having first, second main electrodes and a control electrode, said control electrode being coupled to said first main electrode of said first transistor, said first main electrode being coupled to the output of said first circuit loop means, said second main electrode being coupled to a second power supply conductor, said output of said first circuit loop means being coupled to said second input of said comparator amplifier means.

4. The circuit of claim 3 wherein said first circuit loop means further includes:

a third transistor having first, second main electrodes and a control electrode, said control electrode being coupled to said terminal at which is supplied said reference bias signal, said first main electrode being coupled to said first main electrode of said first transistor, said second main electrode being coupled to said first power supply conductor;

first resistive means coupled between said second power supply conductor and said first main electrode of said first transistor;

second resistive means coupled between said output of said first circuit loop means and said first power supply conductor; and third resistive means coupled between said output of said first circuit loop means and said second input of said comparator amplifier means.

5. The circuit of claim 4 wherein said second circuit loop means includes:

a first transistor having first, second main electrodes and a control electrode, said control electrode being coupled to said output of said comparator amplifier means, said first main electrode being coupled to said second input of said comparator amplifier means; and turn around circuit means coupled between said second main electrode of said first transistor of said second circuit loop means and the output thereof.

6. The circuit of claim 5 wherein said turn around circuit means including diode means coupled between said second power supply conductor and said second main electrode of said first transistor of said second circuit loop means, and a second transistor having first, second main electrodes and a control electrode, said second main electrode being coupled to said output of said second circuit loop means, said first main electrode being coupled to said second power supply conductor, said control electrode being electrically coupled with the second main electrode of said first transistor of said second circuit loop means.

7. The circuit of claim 2 wherein said second circuit loop means includes:

a first transistor having first, second main electrodes and a control electrode, said control electrode being coupled to said output of said comparator amplifier means, said first main electrode being coupled to said second input of said comparator amplifier means; and turn around circuit means coupled between said second main electrode of said first transistor of said second circuit loop means and the output thereof.

8. The circuit of claim 7 wherein said turn around circuit means including diode means coupled between said second power supply conductor and said second main electrode of said first transistor of said second circuit loop means, and a second transistor having first, second main electrodes and a control electrode, said first main electrode being coupled to said output of said second circuit loop means, said second main electrode being coupled to said second power supply conductor, said control electrode being electrically coupled with the second main electrode of said first transistor of said second circuit loop means.

9. The circuit of claim 6 or 8 wherein said comparator amplifier includes:

a first transistor having first, second main electrodes and a control electrode, said control electrode being adapted to receive the input signal, said second main electrode being directly coupled to said second power supply conductor;

a second transistor having first, second main electrodes and a control electrode, said control electrode being said second input, said first main electrode being connected to said first main electrode of said first transistor of said comparator amplifier means, said second main electrode being said output; and current source means coupled between said first main electrodes of said first and second transistors of said comparator amplifier means and said first power supply conductor.

10. A crossover circuit suitable for use in a large scale integrated circuit for providing first and second output signals indicative of the level of an applied input signal, comprising:

comparator amplifier means having first, second inputs and outputs, said comparator amplifier means receiving said input signal at said first input for providing a signal representative thereof at said output;

first circuit loop means coupled between said output and said second input of said comparator amplifier means which receives a bias reference signal for providing the first output signal at an output when the input signal is below a threshold level set by said bias reference signal, said first circuit loop means being rendered non-responsive to the input signal exceeding said threshold for maintaining the first output signal substantially constant at the level reached before the input signal exceeded said threshold level; and second circuit loop means coupled between said output and said second input of said comparator amplifier which is non-responsive to the input signal being less than said threshold level and being rendered responsive to the input signal exceeding said threshold level for producing the second output signal indicative of the level of the input signal for values thereof greater than said threshold level.

11. The crossover circuit of claim 10 wherein said comparator amplifier means comprises a pair of transistors each having first, second electrodes and a control electrode, said first electrodes being coupled in common, said control electrode of the first one of said transistor being said first input, said second electrode of said first transistor being coupled to a second power supply conductor, said control electrode of said second transistor being said second input, said second electrode being said output, and a current source being coupled between said commonly connected first electrodes and a first power supply conductor.

12. The crossover circuit of claim 11 wherein said first circuit loop means includes in combination with said second transistor of said comparator amplifier means:

a third transistor having first, second and control electrodes, said first electrode being coupled to said second power supply conductor, said second electrode being coupled to said first power supply conductor, said control electrode being coupled to said output of said comparator amplifier means;

a fourth transistor having first, second and control electrodes, said first electrode being coupled to said first electrode of said third transistor, said second electrode being coupled to said first power supply conductor, said control electrode receiving said reference bias signal;

a fifth transistor having first, second and control electrodes, said first electrode being coupled to said output of said first circuit loop means, said second electrode being coupled to said second power supply conductor, said control electrode being coupled to said first electrode of said third transistor; and resistive means coupled between said first electrode of said fifth transistor and said second input of said comparator amplifier means.

13. The crossover circuit of claim 12 wherein said second circuit loop means includes in combination with said second transistor:

a sixth transistor having first, second and control electrodes, said first electrode being coupled to said second input of said comparator amplifier means, said control electrode being coupled to said output of said comparator amplifier means, said sixth transistor being held in a non-conducting state by said first circuit loop means until the input signal exceeds said threshold level; and turn around circuit means coupled between said second electrode of said sixth transistor and said output of said second circuit loop means.

14. In a television receiver including a RF tuner amplifier stage and an integrated circuit including an IF amplifier stage and a gated automatic gain control (AGC) circuit, a changeover circuit suitable to be combined with the AGC circuit for providing outputs to control the gain of the RF and IF amplifier stages in response to an automatic gain control signal supplied thereto, comprising:

a first circuit loop receiving a bias signal which establishes a threshold level, said first circuit loop being responsive to the AGC signal having a value less than said threshold level for providing an output at a first output that is indicative of the level of the AGC signal; and a second circuit loop held non-responsive by said first circuit loop when said AGC signal is less than said threshold level, said second circuit loop being responsive to said AGC signal exceeding said threshold signal for providing an output at a second output indicative of the level of the AGC signal, said first circuit loop being non-responsive to maintain said output substantially constant with the AGC signal being greater than said bias signal.

15. In a television receiver including a RF tuner amplifier stage and an integrated circuit including an IF amplifier stage and a gated automatic gain control (AGC) circuit, a changeover circuit suitable to be combined with the AGC circuit for providing outputs to control the gain of the RF and IF amplifier stages in response to an automatic gain control signal supplied thereto, comprising:

a first circuit loop receiving a bias signal which establishes a threshold level, said first circuit loop being responsive to the AGC signal having a value less than said threshold level for providing an output signal at a first output that is indicative of the level of the AGC signal;

a second circuit loop held nonresponsive by said first circuit loop when said AGC signal is less than said threshold level, said second circuit loop being responsive to said AGC signal exceeding said threshold signal for providing an output at a second output indicative of the level of the AGC signal, said first circuit loop being held nonresponsive to maintain said output therefrom substantially constant with the AGC signal being greater than said bias signal; and a comparator amplifier having first, second inputs and an output, said first input receiving the AGC signal, said first and second circuit loops being coupled between said output and said second input of said comparator amplifier.

16. The television receiver of claim 15 wherein said comparator amplifier includes first and second differentially connected transistors, said first transistor receiving said AGC signal at the first input, said second transistor providing an output and said second input.

17. The television receiver of claim 16 wherein said first circuit loop includes:

a third transistor having a first, a second and a control electrode, said control electrode being coupled to said output of said comparator amplifier to said second transistor, said first and second electrodes being coupled to first and second power supply conductors respectively;

a fourth transistor having a first, a second and a control electrode, said control electrode receiving said bias signal, said first and second electrodes being coupled between said first electrode of said third transistor and said second power supply conductor respectively; and a fifth transistor having a first, a second and a control electrode, said control electrode being coupled to said first electrode of said third transistor, said first and second electrodes being coupled between said first output and said first power supply conductor respectively, said first output being coupled to said second input of said comparator amplifier.

18. The television receiver of claim 17 wherein said second circuit loop includes:
   said second transistor; and
   a sixth transistor having a first, a second and a control electrode, said control electrode being coupled to said output of said comparator amplifier, said first electrode being coupled to said second input of said comparator amplifier; and
   turn around circuit means coupled between said second electrode of said sixth transistor and said second output.

* * * * *